United States Patent [19]
Krijntjes

[11] Patent Number: 5,517,035
[45] Date of Patent: May 14, 1996

[54] BROADBAND OPTICAL RECEIVER WITH TRANSFORMER COUPLED INPUT CIRCUIT WHICH IS BALANCED TO MINIMIZE STRAY CAPACITANCES

[75] Inventor: Cornelis J. P. Krijntjes, Nijmegen, Netherlands

[73] Assignee: U.S. Philips Corporation, New York, N.Y.

[21] Appl. No.: 255,631

[22] Filed: Jun. 9, 1994

[30] Foreign Application Priority Data

Jun. 11, 1993 [BE] Belgium ............................. 09300595

[51] Int. Cl.⁶ ................................................ G02B 27/00
[52] U.S. Cl. ...................... 250/551; 250/214 A; 330/308
[58] Field of Search ........................... 250/551, 214 A, 250/214 RC, 214 LA; 330/308, 59; 359/189, 194, 195

[56] References Cited

U.S. PATENT DOCUMENTS 5,013,903  5/1991  Kasper ................................. 250/214 A
5,179,461  1/1993  Blauvelt et al. ........................ 330/308
5,239,402  8/1993  Little, Jr. et al. ...................... 250/214 A
5,347,389  9/1994  Skrobko ............................... 250/214 A

FOREIGN PATENT DOCUMENTS 0555696  8/1993  European Pat. Off. .

OTHER PUBLICATIONS

"Optimum Biasing of Photodiodes as Used in Infrared Communications" IBM Technical Disclosure Bulletin, vol. 30, No. 6, Nov. 1987 pp. 213–214.

Primary Examiner—Edward P. Westin
Assistant Examiner—Que T. Le
Attorney, Agent, or Firm—Leroy Eason

[57] ABSTRACT

In an optical receiver an optical signal received from a glass fiber is fed to an optoelectrical converter. To reduce the influence of parasitic capacitances, the two connection terminals of the converter are connected to a common ground potential via respective impedance elements which are equal, and are also connected by a pair of tapped sub-transformers to the input terminals of a broadband amplifier of the receiver. As a result, a symmetrical signal voltage is developed across the converter and across the input terminals of the amplifier, while the influence of the parasitic capacitances is halved.

2 Claims, 3 Drawing Sheets

1

BROADBAND OPTICAL RECEIVER WITH TRANSFORMER COUPLED INPUT CIRCUIT WHICH IS BALANCED TO MINIMIZE STRAY CAPACITANCES

BACKGROUND OF THE INVENTION

The invention relates to an optical transmission system comprising an optical transmitter coupled over an optical channel to an optical receiver, the optical receiver comprising an optoelectrical converter and an amplifier while a first connection terminal of the optoelectrical converter being coupled to a first input of the amplifier.

The invention likewise relates to an optical receiver to be used in a system of this type.

A transmission system as defined in the opening paragraph is known from the brochure "2610 B Broadband Photodiode Module", Ortel Corporation, May 1991.

Such a transmission system is used, for example, for TV signal distribution over large distances. This takes place, for example, in cable TV networks for TV signal transmission from a remote header station to a cable TV main distribution network.

The cable TV signal to be transmitted, comprising a frequency multiplex of TV and radio signals, is used for amplitude modulation of a light source. The light source will generally comprise a semiconductor laser. The modulated light signal is sent over an optical channel, for example, a glass fibre, to the optical receiver. In the optical receiver the light signal is converted into an electric signal which can be further distributed in the cable network.

The cable TV signal has a frequency range from ±80 MHz to 900 MHz. This means that the transmission system must to be suitable for broadband signals, meaning the aforesaid range. A requirement frequently made on such transmission systems is a passband which is flat within several tenths of dB's or increases with a certain slope with increasing frequency.

Although the transfer characteristic of the prior-art optical transmission system is flat within 1 dB, a flatter transfer characteristic is desired.

It is an object of the invention to provide an optical transmission system as defined in the opening paragraph in which the flatness of the transfer characteristic is improved.

SUMMARY OF THE INVENTION

For this purpose, the invention is characterized in that the first connection terminal of the optoelectrical converter is coupled to a reference potential via a first impedance element, and in that a second connection terminal of the optoelectrical converter is coupled to a second input of the amplifier and, across a second impedance element equal to the first impedance element, to the reference potential.

By the measures according to the invention the electric signal is fully balanced with respect to the reference potential. The influence of parasitic capacitances between the connection terminals of the optoelectrical converter and the reference potential on the transfer characteristic is considerably reduced by this balancing. On the two connection terminals of the optoelectrical converter there are voltages available which have the same amplitude relative to the reference potential but are in phase-opposition relative thereto. As a result, the parasitic capacitances between the terminals of the electro-optical converter and the reference potential have an effect which is comparable to the effect of a capacitor connected between the two terminals of the optoelectrical converter, this capacitor having half the capacitance of the capacitor between either terminal of the optoelectrical converter and the reference potential. In the state-of-the-art transmission system in which the optoelectrical converter is connected unbalanced, said parasitic capacitance causes a resultant capacitance to occur between the terminals of the optoelectrical converter, which resultant capacitance is equal to this parasitic capacitance.

The lower capacitance in the transmission system according to the invention reveals itself in a greater flatness of the transfer characteristic. In addition, the bandwidth of the transmission system according to the invention is considerably larger than the bandwidth of the prior-art system.

An embodiment of the invention is characterized in that the optoelectrical converter is coupled to the amplifier via a transformer.

A transformer used between the optoelectrical converter and the amplifier makes an optimum adaptation possible between the optoelectrical converter and the amplifier by appropriately selecting the transformation ratio.

A further embodiment of the invention is characterized in that the transformer has primary and secondary windings which are partly common.

The use of a common winding for both the primary winding and the secondary winding, results in a simple manufacture of the transformer.

A further embodiment of the invention is characterized in that the transformer comprises two sub-transformers whose primary windings are connected in series and in which the first input of the amplifier is coupled to a tapping point of the primary winding of the first sub-transformer and the second input of the amplifier is connected to a tapping point of the primary winding of the second sub-transformer.

By arranging the transformer as two identical sub-transformers whose primary windings are connected in series, in which the secondary winding of the transformers is located between two tapping points of the two sub-transformers, a fully symmetrical transformer is obtained in a simple manner.

BRIEF DESCRIPTION OF THE DRAWINGS

The invention will be further explained with reference to the drawing Figures in which.

DETAILED DESCRIPTION OF THE PREFERRED EMBODIMENT

Figure 1:
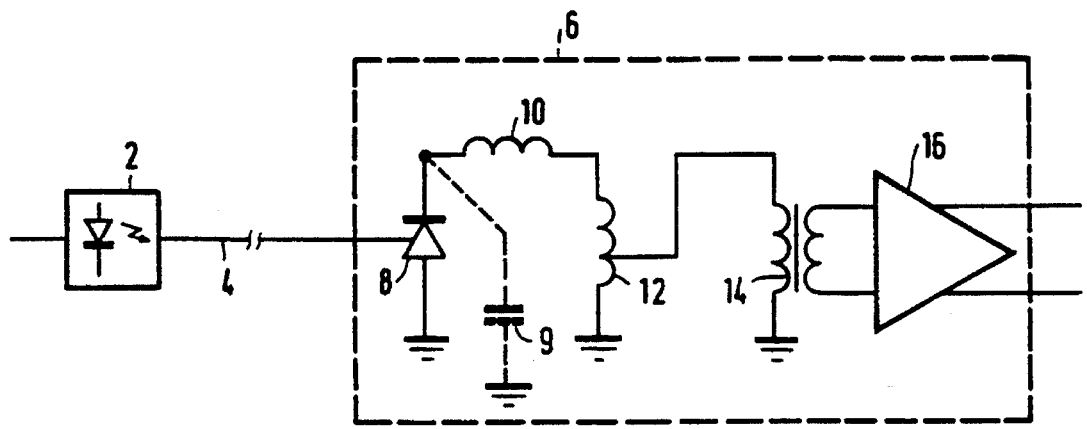
FIG. 1 shows a state-of-the-art optical transmission system.

In the transmission system shown in FIG. 1 the signal to be transmitted is applied to an optical transmitter 2. An output of the optical transmitter 2 is connected to an input of an optical receiver 6 over an optical channel in this case formed by a glass fibre 4. In the optical receiver 6 the input is optically coupled to the optoelectrical converter in this case being a photodiode 8.

A first connection terminal of the photodiode 8, i.e. the anode, is connected to a point of reference potential further to be referenced "earth". A second connection terminal of the photodiode 8, i.e. the cathode, is connected to a first connection terminal of a coil 10. A second connection terminal of the coil 10 is connected to a first connection terminal of a winding of a transformer 12. A second connection terminal of the winding of the transformer 12 is connected to earth. A parasitic capacitor 9 between the cathode of the photodiode 8 and earth is shown as a dotted line.

A tapping point of the winding of the transformer 12 is connected to a first connection terminal of a primary winding of a transformer 14. A second connection terminal of the primary winding of the transformer 14 is connected to earth. A first connection terminal of a secondary winding of the transformer 14 is connected to a first input of an amplifier 16, whereas a second connection terminal of the secondary winding of transformer 14 is connected to a second input of the amplifier 16. The output of the optical receiver 6 is formed by the output of the amplifier 16.

The signal to be transmitted, for example, a frequency multiplex CATV signal, is converted into an intensity-modulated light signal by an electro-optical converter, usually by a laser. This modulated light signal is carried to the optical receiver 6 through the glass fibre 4.

The photodiode 8 reconverts the received light signal into an electric signal. This electric signal is transferred to the amplifier 16 via the transformer 12 and the transformer 14. The parasitic capacitor 9 in parallel with the photodiode 8 largely determines the high-frequency behaviour of the optical receiver. The inductance value of the coil 10 is selected such that the transfer function shows a desired flatness. The transformer 12 is included for matching the output impedance of the diode 8 to a load impedance of 75 Ω.

The transformer 14 converts the asymmetric signal at the output of the transformer 12 into a symmetric signal which can be amplified to the desired level by the amplifier 16. The amplifier 16 may, for example, be of the BGY685 or BGY787 type marketed by Philips Semiconductors.

Figure 2:
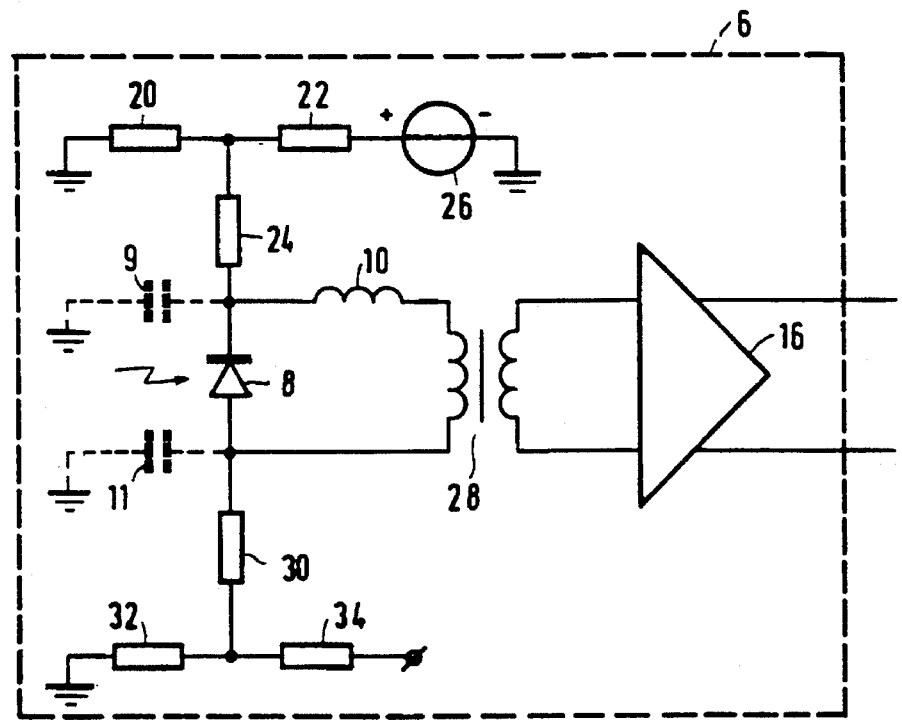
FIG. 2 shows an optical transmission system according to the invention.

In the optical receiver as shown in FIG. 2 the cathode of the photodiode 8 is connected to a first connection terminal of a resistor 24, a first connection terminal of a coil 10 and a first connection terminal of a (parasitic) capacitor 9. A second connection terminal of the resistor 24 is connected to a first connection terminal of a resistor 20 and to a first connection terminal of a resistor 22. A second connection terminal of the resistor 20 is connected to earth, whereas the second connection terminal of the resistor 22 is connected to a positive terminal of a voltage source 26. A negative terminal of the voltage source 26 is connected to earth.

The anode of the photodiode 8 is connected to a first connection terminal of the resistor 30, a first connection terminal of a primary winding of a transformer 28, and a first connection terminal of a (parasitic) capacitor 11. A second connection terminal of the resistor 30 is connected to a first connection terminal of a resistor 32 and to a first connecting point of a resistor 34. A second connection terminal of the resistor 34 is connected to a test point. A second connecting point of the capacitors 9 and 11 is also connected to earth.

A second connection terminal of the coil 10 is connected to a second connection terminal of the primary winding of the transformer 28. The connecting terminals of the secondary winding of the transformer 28 are connected to inputs of the amplifier 16, which amplifier supplies at its output the output signal of the optical receiver.

The voltage source 26 combined with the voltage divider formed by the resistors 20 and 22 applies an inhibit voltage to the cathode of photodiode 8. By equalizing the impedance to earth seen at the cathode of the photodiode 8 and the impedance to earth seen at the anode of the photodiode it, is achieved that at the occurrence of an optical input signal the current produced by the photodiode 8 is converted into a voltage which is symmetrical relative to earth.

The parasitic capacitors 9 and 11 may be considered to be replaced by a single capacitor having half the capacitance, because these capacitors are connected in series for the anti-symmetrical behaviour. Since these parasitic capacitors have a considerable effect on the high-frequency properties of the optical receiver, the reduction of the effective parasitic capacitance will significantly improve the high-frequency properties of the receiver in that the input section of the optical receiver is rendered symmetrical relative to earth.

The transformer 28 provides that the output impedance of the optoelectrical converter is matched to the input impedance of the amplifier 16. The coil 10, which may be adjustable, is used for obtaining as fiat a transfer characteristic as possible. The amplifier 16 may be of the BGY685 or BGY787 type. On the outputs of the amplifier 16 the output signal of the optical receiver is available.

Figure 3:
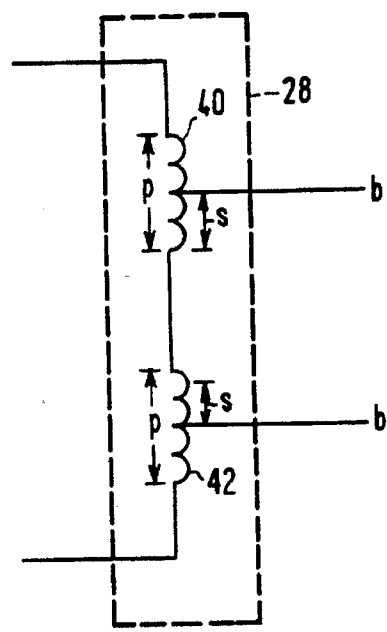
FIG. 3 shows an embodiment of the transformer according to the invention.

In FIG. 3 the transformer 28 is formed by two series-arranged subtransformers 40 and 42. These sub-transformers each have a secondary winding S which comprises a part (half in this case) of the primary winding P. This structure of the transformer 28 is advantageous in that the transformer 28 is fully symmetrical.

Figure 4:
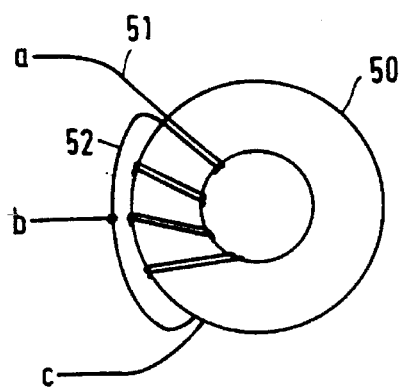
FIG. 4 shows the mechanical structure of one of the sub-transformers used in the transformer shown in FIG. 3.

FIG. 4 represents the mechanical structure of one of the sub-transformers shown in FIG. 3. The sub-transformer is constituted by a ring core 50 on which a bifilar winding, i.e. the windings 51 and 52, is applied. The two windings 51 and 52 are connected in series and the central tap is formed by the node between the windings 51 and 52.

Figure 5:
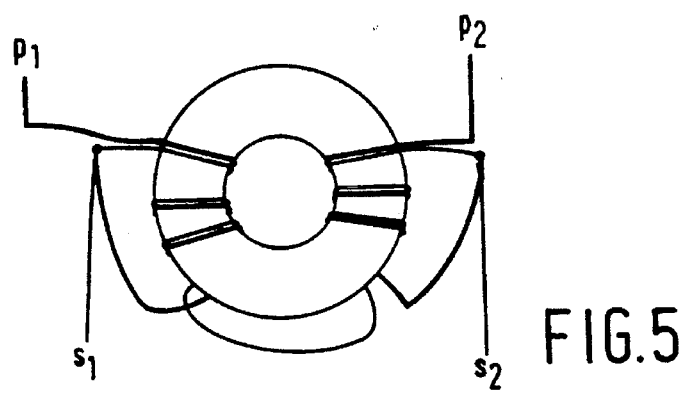
FIG. 5 shows the structure of the combination of two sub-transformers as shown in FIG. 4.
Figure 6:
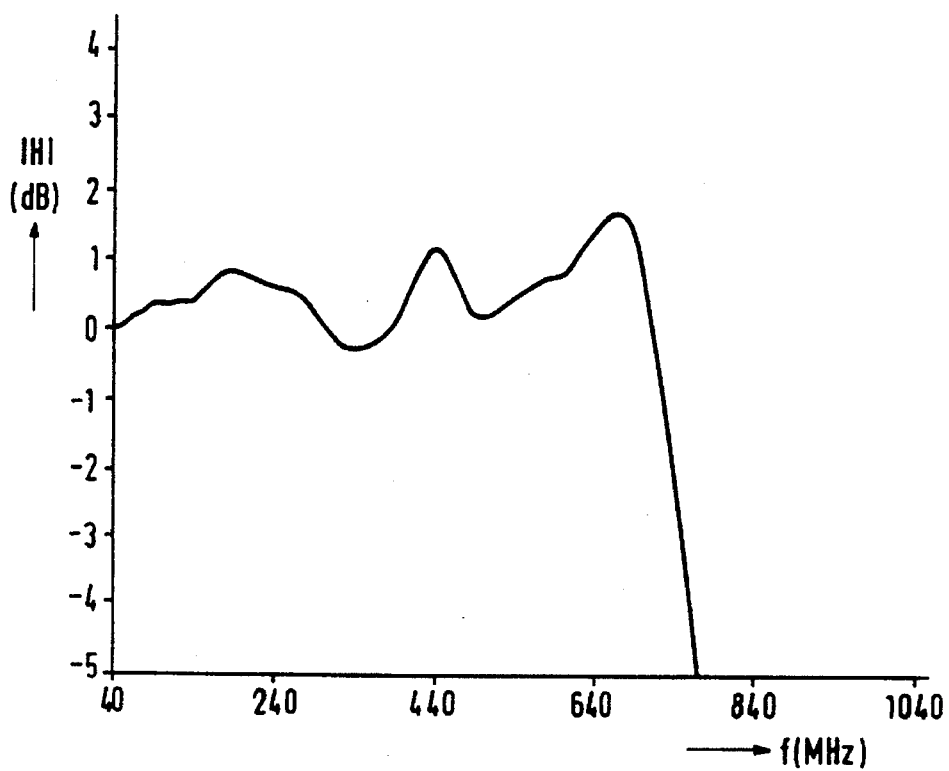
FIG. 6 shows a measured transfer characteristic of a state-of-the-art optical transmission system.

In the transformer shown in FIG. 5 the two sub-transformers are accommodated on a single core as it were. The advantage of this is that only a single core is needed. Since the two sub-windings have opposite directions of winding, a direct current flowing through the two sub-windings does not cause a premagnetization of the core to occur. Such a direct current is often present as a bias current for the transistors included in the amplifier 16. FIG. 6 shows the transfer characteristic of a state-of-the-art optical receiver. FIG. 6 distinctly shows that the transfer characteristic presents variations of more than 1 dB in the transfer band, the maximum frequency (−1 dB) being about 735 MHz.

Figure 7:
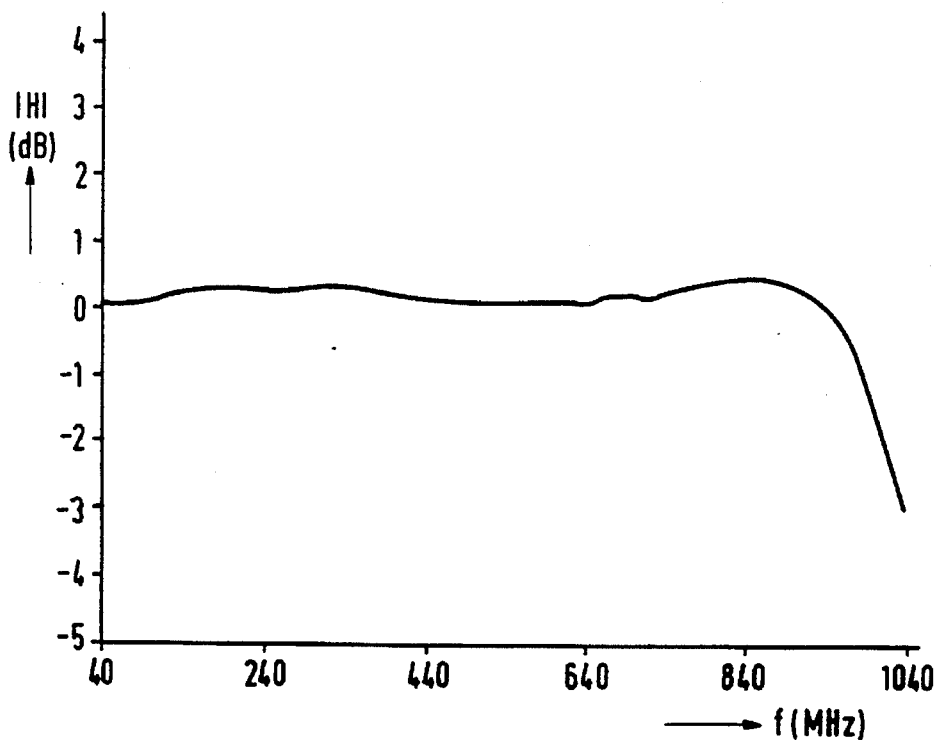
FIG. 7 shows a measured transfer characteristic of an optical transmission system according to the invention.

FIG. 7 shows the transfer characteristic of an optical receiver according to the invention. From FIG. 7 it appears that the transfer characteristic is flat within 0.5 dB inside the passband, whereas the maximum frequency (−1 dB) is now about 1 GHz.

I claim:
1. An optical receiver for use in an optical transmission system, comprising:
  an optoelectric converter for receiving an optical signal and producing an electrical signal corresponding thereto across a pair of connection terminals of said converter;

a pair of impedance elements respectively coupling each of said connection terminals to a common reference potential, said impedance elements being of equal impedance;

a broadband amplifier having a pair of input terminals and a pair of output terminals; and a pair of sub-transformers each having a primary winding with a tap thereon, the two primary windings being connected in series across the connection terminals of said converter to receive the electrical signal produced thereby, each sub-transformer having a secondary winding which is constituted by the portion of the primary winding thereof between the tap thereon and the primary winding of the other sub-transformer, so that a transformed electrical signal corresponding to the received electrical signal is produced across the serially connected secondary windings of said pair of sub-transformers; the taps of said sub-transformers being connected across the input terminals of said amplifier to supply the transformed electrical signal thereto;

whereby an amplified electrical signal is produced across the output terminals of said amplifier corresponding to the received optical signal.

2. An optical receiver as claimed in claim 1, wherein the windings of the two sub-transformers are on a single core and the direction of the windings of a first of said sub-transformers is opposite to the direction of the windings of the second of the sub-transformers.

* * * * *